United States Patent [19]

Tobita

[11] Patent Number: 5,726,941
[45] Date of Patent: Mar. 10, 1998

[54] SEMICONDUCTOR INTEGRATED CIRCUIT

[75] Inventor: Youichi Tobita, Tokyo, Japan

[73] Assignee: Mitsubishi Denki Kabushiki Kaisha, Tokyo, Japan

[21] Appl. No.: 762,903

[22] Filed: Dec. 10, 1996

[30] Foreign Application Priority Data

Dec. 11, 1995 [JP] Japan ................. 7-321760

[51] Int. Cl.[6] ............................................. G11C 13/00
[52] U.S. Cl. ...................... 365/203; 365/229; 365/149
[58] Field of Search .......................... 365/203, 226, 365/229, 149, 150

[56] References Cited

U.S. PATENT DOCUMENTS

| Re. 34,290 | 6/1993 | Tobita ........................... 323/312 |
| 3,805,095 | 4/1974 | Lee et al. ....................... 307/304 |
| 4,422,163 | 12/1983 | Oldenkamp ..................... 365/229 |
| 4,559,548 | 12/1985 | Iizuka et al. .................... 357/23.6 |
| 4,692,689 | 9/1987 | Takemae ........................ 323/313 |
| 5,073,874 | 12/1991 | Yamada et al. . | |

FOREIGN PATENT DOCUMENTS

| 57-157315 | 9/1982 | Japan . |
| 62-85669 | 4/1987 | Japan . |

*Primary Examiner*—Terrell W. Fears
*Attorney, Agent, or Firm*—Lowe, Price, LeBlanc & Becker

[57] ABSTRACT

A power-on reset circuit for generating a power-on reset signal includes a capacitor which is charged in response to the application of an external power supply potential to an internal circuit. The capacitor is discharged through a diode-connected MOS transistor having its back gate and gate connected together, to prevent malfunction of the POR circuit when the external power supply potential is reapplied.

9 Claims, 7 Drawing Sheets $$V_{th} = V_0 + K(\sqrt{2\phi F + V_{BS}} - \sqrt{2\phi F})$$

SEMICONDUCTOR INTEGRATED CIRCUIT

TECHNICAL FIELD

The present invention relates to a semiconductor integrated circuit and, more particularly, to a semiconductor integrated circuit including a power-on reset circuit utilizing a threshold voltage of a diode-connected MOS transistor.

BACKGROUND ART

Against the background of a wide and rapid spread of portable equipment such as notebook-type personal computers, cellular phones, personal handy phones, etc., there is an increasing need for a semiconductor integrated circuit of small power consumption. As a method for achieving small power consumption, it has been proposed to operate a semiconductor integrated circuit with a power source of low voltage. When driving a semiconductor integrated circuit with a low voltage power source, however, a disadvantage arises in that the ratio of a voltage drop due to the threshold voltage of an MOS transistor to a low source potential is large, and it becomes difficult to achieve an effective potential discharge utilizing the threshold voltage of a MOS transistor, which seriously affects the design of circuit.

FIG. 8 shows a conventional power-on reset circuit (hereinafter referred to as a POR circuit) for generating a power-on reset signal (hereinafter referred to as a POR signal). A POR circuit is used to control and initialize an internal circuit at the moment of power-on, as described in U.S. Pat. No. 5,073,874, for example. In FIG. 8, reference numeral 1a designates a source potential node to which an external source potential is applied; numeral 1b designates an earth potential node to which an earth potential $V_{ss}$ is applied; and numerals 2a and 2b designate a pair of diode-connected P-channel MOS transistors in which each transistor has its gate connected to its drain, and which are connected in series between the source potential node 1a and a connecting node 2. Numeral 2c designates a capacitor connected between the connecting node 2 and the earth potential node 1b, and numeral 3 designates an inverter comprised of a P-channel MOS transistor 3a and an N-channel MOS transistor 3b. An input terminal of the inverter 3 receives a potential NN2 of the connecting node 2, and an output terminal of inverter 3 provides a power-on reset signal POR.

Next, operation of the conventional POR circuit of the above arrangement is hereinafter described. FIG. 9 is a timing chart showing the operation of the conventional POR circuit shown in FIG. 8 at the moments of power-on and power-off. In FIG. 9, reference numeral (a) indicates a fluctuation in the potential $V_{cc}$ of the source potential node 1a, numeral (b) indicates a fluctuation in a potential NN2 of the connecting node 2, and numeral (c) indicates a fluctuation in a potential POR of the POR signal, which is an output of the POR circuit shown in FIG. 8. In addition, the absolute value of a threshold voltage of a MOS transistor is indicated by $|V_{th}|$, and the threshold value of the inverter is indicated by $V_T$.

When the external power source potential is first applied to source potential node 1a, the potential $V_{cc}$ of the source potential node 1a begins to rise steeply from a low level of approximately ground potential to a high level of approximately the external source potential, at time $t_0$. When the potential $V_{cc}$ of the source potential node 1a has reached the level of $|V_{th}|$ which is a threshold voltage of the P-channel MOS transistor 3a at time $t_1$, the P-channel MOS transistor 3a becomes conductive, and the potential POR of the POR signal begins to rise steeply. Then, when the potential $V_{cc}$ of the source potential node 1a rises further and has reached $2|V_{th}|$ which is a sum of threshold voltages of the P-channel MOS transistors 2a and 2b at time $t_2$, both diode-connected P-channel MOS transistors 2a and 2b become conductive, whereby the capacitor 2c starts to charge from approximately ground potential $V_{ss}$ to $V_{cc} - 2|V_{th}|$. As shown in FIGS. 9a and 9b, the potential NN2 of the connecting node 2 begins to rise more gently than the potential rise of the source potential node 1a. When at time $t_3$ the potential NN2 of the node 2 has exceeded $V_T$ which is the threshold voltage of the inverter 3, the inverter 3 is inverted and the potential POR of the POR signal begins to drop sharply. As a result of the foregoing operation, the POR signal is generated to control and initialize the internal circuit at the moment of power-on.

Thereafter, when the external power source is turned off, that is, when the potential $V_{cc}$ of the source potential node 1a begins to decrease to the earth potential $V_{ss}$, electric charge accumulated in the capacitor 2c is gradually discharged through the inherent wiring capacitance, whereby the potential NN2 of the node 2 also begins to decrease slowly, as shown at time $t_4$. In the POR circuit shown in FIG. 8, however, since no discharge path is disposed on the node 2, and discharge occurs only via wiring capacitance, it takes a long time before the potential NN2 of the node 2 decreases to a potential equal to the earth potential $V_{ss}$ after the external power source is turned off. Consequently, when the external power source is turned on again before the electric charge accumulated in the capacitor 2c and wiring capacity of the node 2 is sufficiently discharged, i.e., at time $t_6$ before a sufficient drop of the potential NN2 of the node 2, the potential $V_{cc}$ of the source potential node 1a must rise to $V\alpha+|V_{th}|$ at time $t_7$, before the P-channel MOS transistor 3a of the inverter 3 can conduct again, causing the potential POR of the POR signal to rise. In this respect, $V\alpha$ indicates a potential of the node 2 at time $t_6$. Then, when the potential $V_{cc}$ of the source potential node 1a rises and has reached $V\alpha+2|V_{th}|$, which is a potential higher than $V\alpha$ and a sum of the threshold values of the P-channel MOS transistors 2a and 2b, both diode-connected P-channel MOS transistors 2a and 2b become conductive at time $t_8$, whereby charge of the capacitor 2c is started, and the potential NN2 of the node 2 begins to rise again. When the potential NN2 of the node 2 has exceeded $V_T$ which is the threshold voltage of the inverter 3 at time $t_9$, the inverter 3 is inverted and the potential POR of the POR signal begins to drop. In this operation, however, because the capacitor begins to charge from potential $V\alpha$ when the external power source is turned on again, the period from time $t_7$ to time $t_9$ for deciding a pulse duration of the POR signal is shortened appreciably, as compared with the period from time $t_1$ to time $t_3$ during which the capacitor 2c begins to charge from earth potential $V_{ss}$.

DISCLOSURE OF THE INVENTION

In the conventional POR circuit of above arrangement, when the power source is turned on again after turning it off once, a problem exists, because the discharge of the electric charge accumulated in the capacitor 2c and wiring capacity of the node 2 is slow and deficient. Therefore, any POR signal to control and initialize the internal circuit at the moment that the external power supply is turned on again is not generated, or even if it is generated, the generated POR signal is not a normal pulser thereby causing an erroneous operation.

In the operation with a low voltage external power source, because of deficient discharge of the electric charge accumulated in the capacitor 2c and wiring capacity of the node 2 at the moment the power source is turned off, the potential V α generated in the node 2 and the threshold voltage $|V_{th}|$ of the MOS transistor occupy a large percentage in the source voltage and, therefore, another problem exists in that it is difficult to reduce the potential of the node 2 to the earth potential $V_{ss}$ utilizing a conventional MOS transistor immediately after turning the power source off.

The present invention was made to solve the above-problems. Therefore, an object of the present invention is to provide a semiconductor integrated circuit which is capable of rapidly discharging an electric charge accumulated in an internal circuit after the power source is turned off and is capable of reducing the electric charge approximately to an earth potential.

Another object of the invention is to provide a semiconductor integrated circuit comprising a POR circuit in which a normal POR signal pulse is generated to control and initialize an internal circuit at the moment the power source is turned on, even if the period of time breaking between turning the power source off and on again is relatively short.

According to a first aspect of the invention, a semiconductor integrated circuit comprises a discharge element comprised of a MOS transistor which is diode-connected between a power supply node and a connecting node so as to be disposed in a forward direction from the connection node to the source potential node, in which a back gate of the MOS transistor is connected to a gate thereof.

A semiconductor integrated circuit comprises a source potential responsive circuit including a pull-up circuit connected between a source potential node and a connecting node, and a capacitor connected between said connecting node and an earth potential node, the pull-up circuit conducting a charging current from the source potential node to the connecting node to charge the capacitor when a rising potential applied to the source potential node exceeds a potential at the connecting node by a predetermined threshold value; a holding circuit responsive to the potential at the connecting node for outputting a power-on reset signal changing from a first level to a second level when the potential at the connecting node exceeds a first predetermined level, and for holding the potential of the power-on reset signal at the second level until the potential of the connecting node exceeds a second predetermined level higher than said first predetermined level; and a threshold responsive discharge element for discharging the capacitor via the connecting node to the source potential node when the potential of the connecting node exceeds the potential at the source potential node by approximately 0.25 volt.

According to another aspect of the invention, an operating method for a power-on reset circuit including a source potential node for receiving an external power source potential having a given rise time, an earth potential node for receiving an earth potential, and a capacitor coupled between the source and earth potential nodes for receiving a charge from said external power source potential, comprises charging the capacitor in response to a change of potential at the source potential node from a first potential to a second potential to generate a rising capacitor voltage; activating a power-on reset signal in response to the rising capacitor voltage; and discharging the capacitor into the source potential node when the capacitor potential exceeds the potential of the source potential node by approximately 0.25 volt.

BRIEF DESCRIPTION OF THE DRAWINGS

In all figures, like elements are given the same reference numbers.

DETAILED DESCRIPTION OF THE PREFERRED EMBODIMENTS

Figure 1:
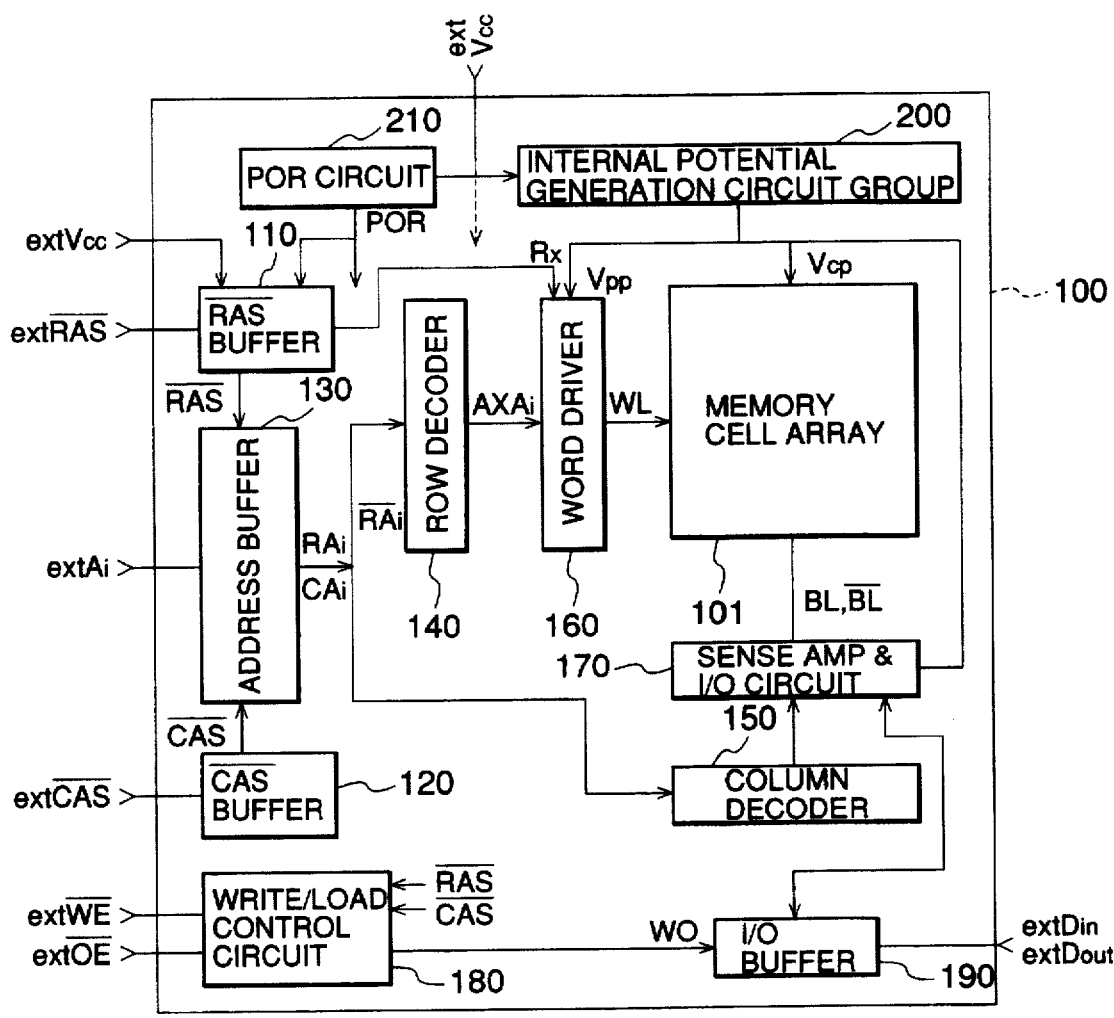
FIG. 1 is a block diagram of DRAM in which the present invention is applied.

FIG. 1 shows a block diagram of the DRAM (Dynamic Random Access Memory) 100 in which the invention is applied, including an internal potential generation circuit group 200, a POR circuit 210 and a memory cell array 101 comprised of a plurality of memory cells arranged in a plurality of rows and columns. A /RAS (Row Address Strobe) buffer 110 receives an external /RAS signal and outputs a /RAS signal to an address buffer 130, and a /CAS (Column Address Strobe) buffer 120 receives an external /CAS signal and outputs a /CAS signal to the address buffer 130. The address buffer 130 receives an external address signal ext Ai (i=0, 1, 2, . . . ) and the /RAS signal, latches the external address signal ext Ai, and outputs row address signals RAi and /RAi for the internal circuits, and receives the external address signal ext Ai (i=0, 1, 2, . . . ) and the /CAS signal, latches the external address signal ext Ai, and outputs column address signals CAi and /CAi for the internal circuit.

A row decoder 140 receives the row address signals RAi and /RAi from the address buffer 130 and selects a corresponding word line; a column decoder 150 receives the CAi and /CAi signals from the address buffer 130 and selects a corresponding sense amplifier and I/O circuit 170 which amplifies a potential of a memory cell read out on a bit line, and transfers data of the memory cell read out on the bit line. Numeral 160 designates a word driver for boosting a potential of the word line selected by the row decoder 140; 180 designates a write and read control circuit which receives a write enable signal ext /WE and an output enable signal ext /OE, and outputs a signal WO for controlling read and write of the internal circuit. Numeral 190 designates an I/O buffer which receives the signal WO output from the write and read control circuit 180, transfers data ext Din to the I/O and sense amplifier 170 through a data line in case of write, and outputs read data of the memory cell amplified in the sense amplifier 170 and transferred through an I/O circuit data line as data ext Dour in case of readout.

In FIG. 1, POR circuit 210 is a circuit for generating a POR signal for control and initialization of the internal circuits, such as the internal potential generation circuit group 200 and the /RAS buffer 110, and others a predetermined time after the power source is turned on.

Figure 2:
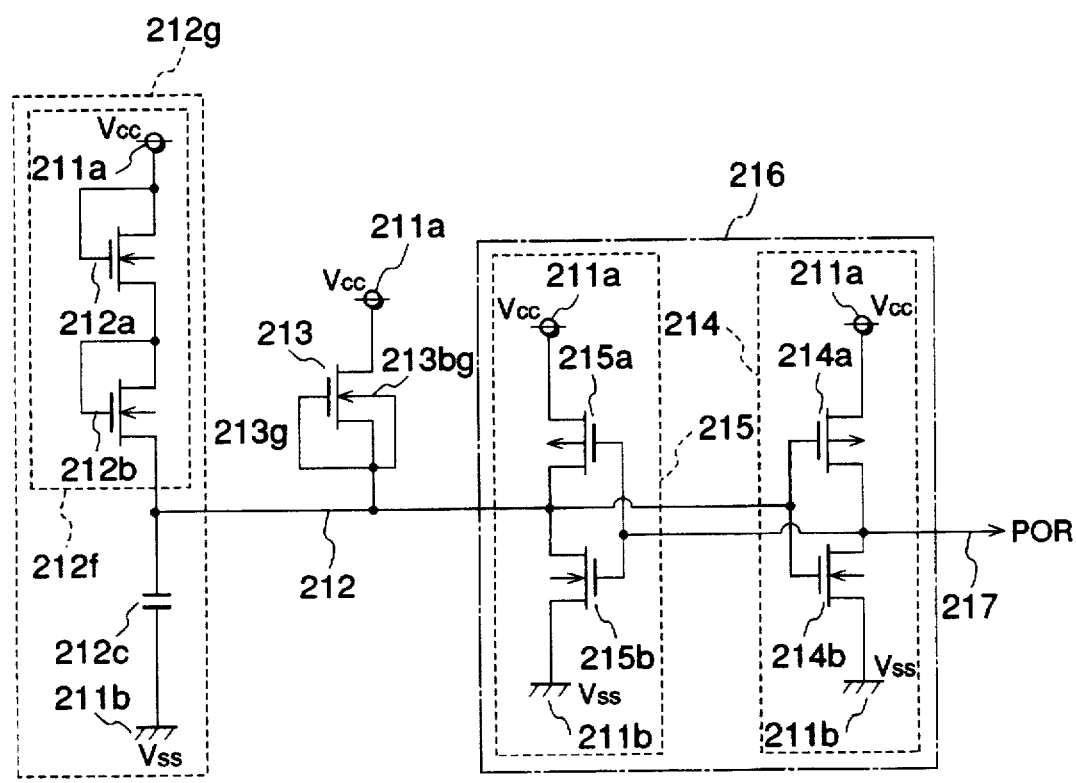
FIG. 2 is a POR generation circuit according to an embodiment of the invention.
Figure 3:
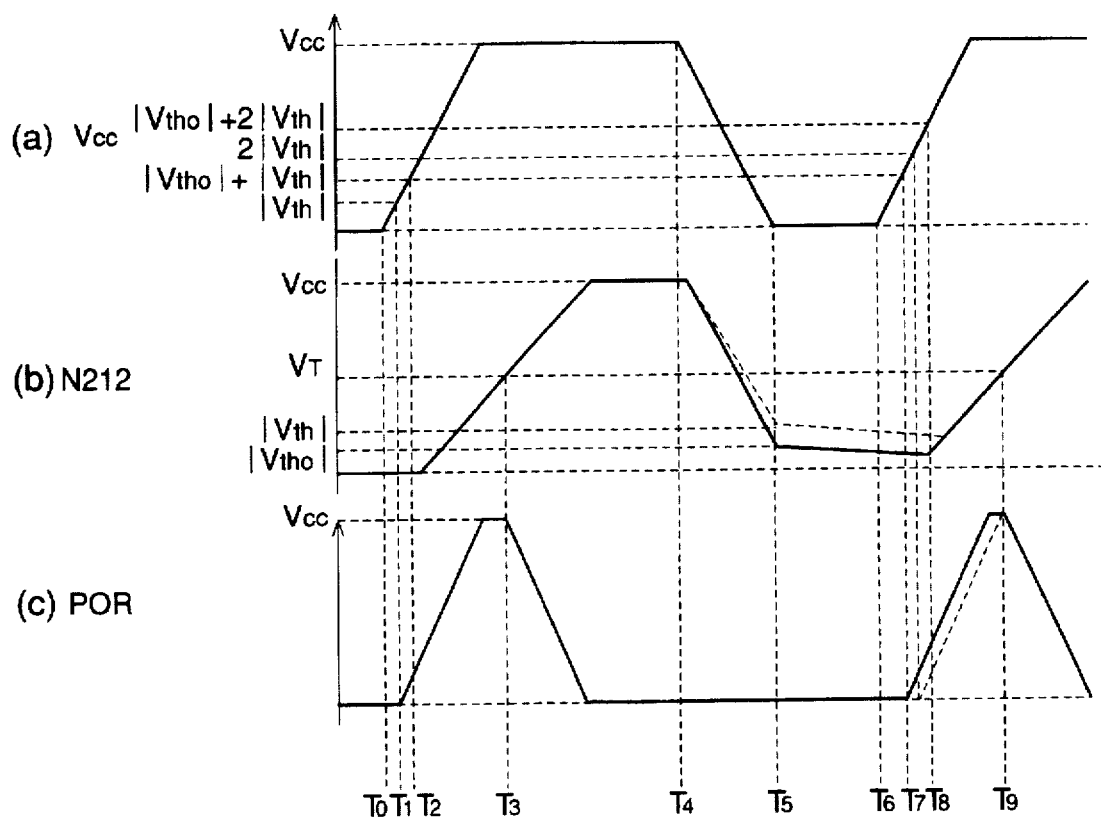
FIG. 3 is a timing chart showing the operation of the POR generation circuit according to the invention.

FIG. 2 is a circuit diagram of the POR circuit 210 showing a preferred embodiment of this invention, and FIG. 3 is a timing chart showing operation thereof. In FIG. 2, reference numeral 211a designates a source potential node to which an external source potential is applied; numeral 211b designates an earth potential node to which ground potential $V_{ss}$ is applied; and numerals 212a and 212b designate diode-connected N-channel MOS transistors in which respective gates and drains are connected. The diode-connected MOS transistors 212a and 212b are connected in series between the power supply node 211a and the connecting node 212, so as to be disposed in a forward direction from the source potential node 211a to the node 212, thereby forming a pull-up circuit 212f. Numeral 212c designates a capacitor which is connected between the node 212 and the earth potential node 211b, and together with the pull-up circuit 212f forms a source potential response circuit 212g. Numeral 214 designates an inverter comprised of a P-channel MOS transistor 214a and an N-channel MOS transistor 214b, in which an input receives the potential of the node 212 and an output 217 outputs the POR signal. Numeral 215 is also an inverter comprised of a P-channel MOS transistor 215a and an N-channel MOS transistor 215b, in which the input receives the POR signal, and the output side is connected to the node 212. Numeral 216 designates a holding circuit comprised of the inverter 214 and the inverter 215. Numeral 213 designates an N-channel MOS transistor which is connected between the source potential node 211a and the node 212, so as to be disposed in forward direction from the node 212 to the power supply node 211a, and in which a back gate 213bg is connected to a gate 213g. Therefore, the MOS transistor 213 works as a threshold responsive discharging transistor. That is, MOS transistor 213 is conductive and discharges the electric charge accumulated in the capacitor 212c and the wiring capacity of the node 212 when the potential $V_{cc}$ of the source potential node 211a drops below the potential of the node 212 by a threshold voltage of the N-channel MOS transistor 213.

Figure 4:
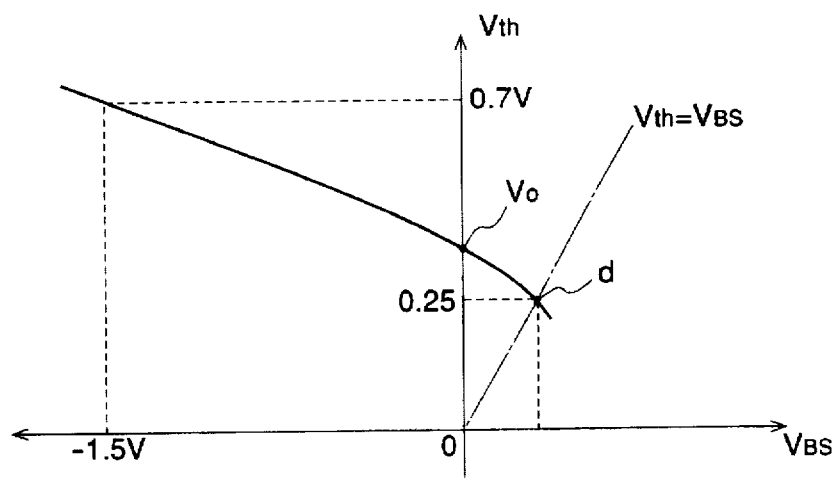
FIG. 4 is a graph showing a characteristic of the threshold voltage of a MOS transistor with respect to the voltage between the back gate and the source according to the invention.

The threshold voltage of a MOS transistor in which the back gate is connected to a gate thereof is hereinafter described with reference to FIG. 4. FIG. 4 is a graph showing schematically a fluctuation in the threshold voltage $V_{th}$ of a MOS transistor with respect to a potential difference VBS between the back gate and the source of the MOS transistor, and the potential difference is shown in the following expression (1).

$$Vth=V_0+K[(2 \phi F+V_{BS})^{1/2}-(2 \phi F)^{1/2}] \quad (1)$$

where: $V_{BS}$ indicates a back gate voltage (on the basis of source voltage), K indicates a body effect constants $\phi$ F indicates a surface potential, and $V_0$ indicates a threshold voltage when $V_{BS}=0V$.

In the graph of FIG. 4, d indicates a point at which the potential difference $V_{BS}$ between the back gate and the source of the MOS transistor is equal to the threshold voltage Vth of the MOS transistor. As is explicit from FIG. 4, as a result of $V_{BS}=V_{th}$, it becomes possible to reduce 0.7V, which is a threshold voltage of the MOS transistor in the conventional $V_{BS}=-1.5V$, to 0.25V, or approximately one third. The reduced voltage of 0.25V is smaller than the threshold voltage $V_0$ (0.35V) of the MOS transistor in case of $V_{BS}=0V$ by 0.1V. This point d, where, $V_{BS}=V_{th}$, may be obtained by connecting the back gate and the gate in the MOS transistor together. In the description given hereinafter, for the sake of distinction, $|V_{th}0|$ indicates an absolute value of the threshold voltage of the MOS transistor having the back gate and the gate connected together, while $|V_{th}|$ indicating the conventional threshold voltage at $V_{BS}=-1.5V$.

Next, operation of the POR circuit 210 of above arrangement is hereinafter described. In FIG. 3, (a) indicates a fluctuation in the potential $V_{cc}$ of the power supply node 211a, (b) indicates a fluctuation in the potential N212 of the connecting node 212, and (c) indicates a fluctuation in the potential POR of the POR signal, which is an output of the POR circuit 210.

When the external power source potential is first applied to source potential node 211a, the potential $V_{cc}$ node 211a begins to rise at time $T_0$ as shown in FIG. 3(a). When the potential $V_{cc}$ of the source potential node 211a has reached to the $|V_{th}|$ level which is a threshold voltage of the P-channel MOS transistor 214a at time $T_1$, as shown in FIG. 3(a), the P-channel MOS transistor 214a becomes conductive and the potential POR of the POR signal begins to rise, as shown in FIG. 3(c). When the potential $V_{cc}$ of the power supply node 211a further rises and comes to reach the $|2V_{th}|$ level which is a sum of the threshold voltages of the N-channel MOS transistors 212a and 212b at time $T_2$, as shown in FIG. 3(a), both N-channel MOS transistors 212a and 212b become conductive and the capacitor 212c starts to charge, whereby the potential N212 of the node 212 begins to rise more gently that the potential rise of the source potential node 211a, as shown in FIG. 3(b). When the potential N212 of the node 212 has exceeded a threshold voltage $V_T$ of the inverter 214 at time $T_3$, as shown in FIG. 3(b), the inverter 214 is inverted, that is, MOS transistor 214a is cut off and MOS transistor 214b is turned on. As a result, the potential POR of the POR signal begins to drop, as shown in FIG. 3(c). By the mentioned operation, the POR signal used for controlling and initializing an internal circuit at the moment of power source turn-on is generated. During the operation period, the diode-connected discharging N-channel MOS transistor 213 is kept reverse-biased at all times and does not permit any current to flow. The inverter 215 performs a function of raising the potential of the connection node 212 to the source potential level, and forms a latch together with the inverter 214 to hold the POR signal high.

When the power source is turned off, the potential $V_{cc}$ of the source potential node 211a begins to drop at time $T_4$, as shown in FIG. 3(a). With the advance of the potential drop, the electric charge accumulated in the capacitor 212c and the wiring capacity of the node 212 is gradually discharged through the P-channel MOS transistor 215a and the forward biased diode-connected discharging N-channel MOS transistor 213, whereby the potential N212 of the node 212 drops, as shown in FIG. 3(b). When the potential $V_{cc}$ of the source potential node 211a becomes equal to the ground potential $V_{ss}$, the potential N212 drops down to the threshold voltage $|V_{th}0|$ level of the discharging N-MOS transistor 213 at time $T_5$, as shown in FIG. 3(b). However, if the back gate of the discharging N-channel MOS transistor 213 were not connected to the gate, i.e., as when the back gate is connected to the substrate potential $V_{BB}$ or to the grounding potential $V_{ss}$, then the potential N212 of the node 212 would drop down only to the threshold voltage level $|V_{th}|$ which is higher than threshold voltage level $|V_{th}0|$.

Subsequently, when the power source it turned on again at time $T_6$, the potential $V_{cc}$ of the source potential node 211a exceeds the $|V_{th}0|+V_{th}|$ at time $T_7$, as shown in FIG. 3(b). At this moment, the P-channel MOS transistor 214a becomes conductive and the potential POR of the POR signal begins to rise, as shown in FIG. 3(c). When the potential $V_{cc}$ of the source potential node 211a is further raised and has reached a potential $|V_{tn}0|+2|V_{tn}|$, i.e., higher than $|V_{tn}0|$ by $2|V_{tn}|$, which is a sum of the threshold voltages of the N-channel MOS transistors 212a and 212b at time $T_8$, both diode-connected N-channel MOS transistors 212a and 212b become conductive, and charging of the capacitor 212c is started, whereby the potential N212 of the node 212 begins to rise as shown in FIG. 3(b). Further, when the potential N212 of the node 212 has reached the threshold voltage $V_T$ of the inverter at time $T_9$, as shown in FIG. 3(b), the output of inverter 214 is inverted, and the potential POR of the POR signal begins to drop, as shown in FIG. 3(c). On the other hand, had the potential N212 of the node 212 dropped to the $|V_{tn}|$ level only, rather than the $|V_{tn0}|$ level, the potential POR of the POR signal would not have been a normal pulse signal, as indicated by the dot line in FIG. 3(c).

As described above, in the POR circuit of the invention, the electric charge accumulated in the capacitor 212c and wiring capacity of the node 212 is discharged rapidly to a sufficient level after the power source is interrupted or turned off, whereby the POR signal becomes a normal pulse signal even if the time from turning off the power source to reapplying it again is shortened. Accordingly, it is possible to prevent the semiconductor integrated circuit from erroneous operation at the time the power source is turned on.

Figure 5:
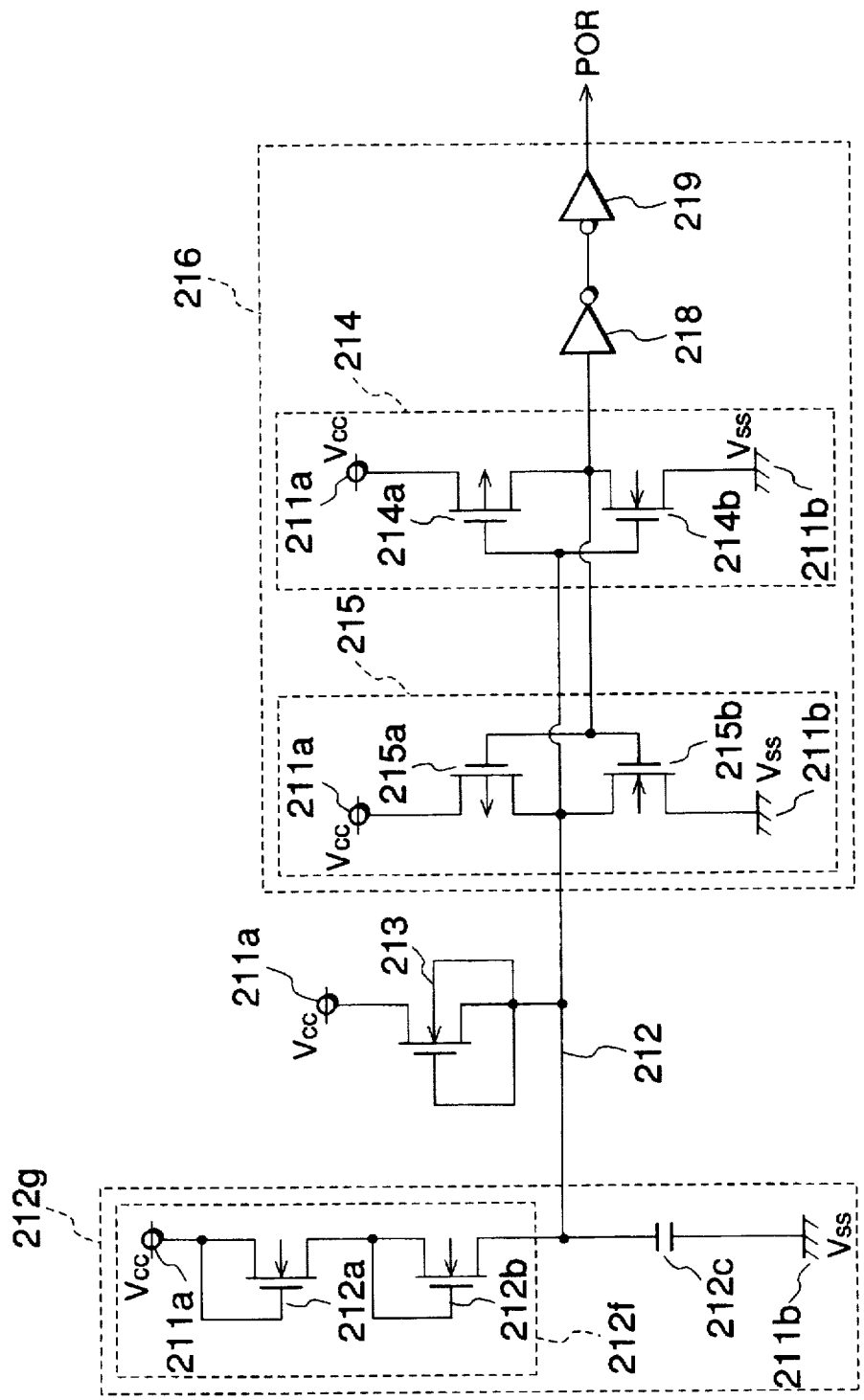
FIG. 5 is a circuit diagram showing the POR generation circuit according to another embodiment of the invention.

Although the arrangement comprising the two inverters 214 and 215 is employed as the holding circuit 216 in this embodiment, it is also possible to connect multiple stages of inverters 218 and 219 to the output node of the inverter 214 serving as drivers, as shown in FIG. 5.

Figure 6:
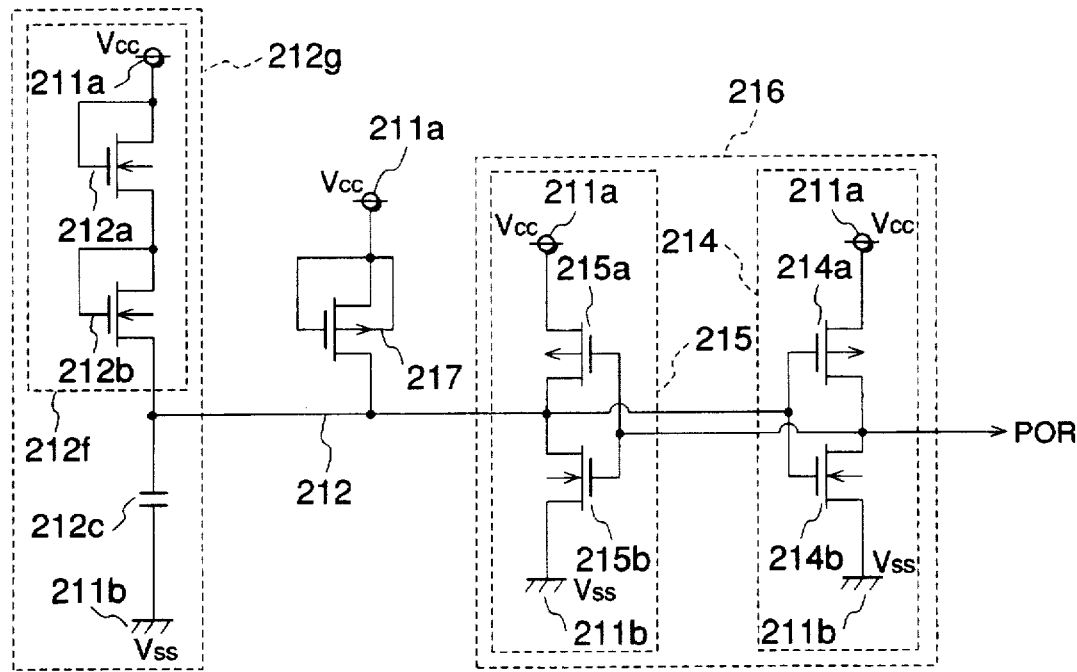
FIG. 6 is a circuit diagram showing a further example of the POR generation circuit according to the invention.
Figure 7:
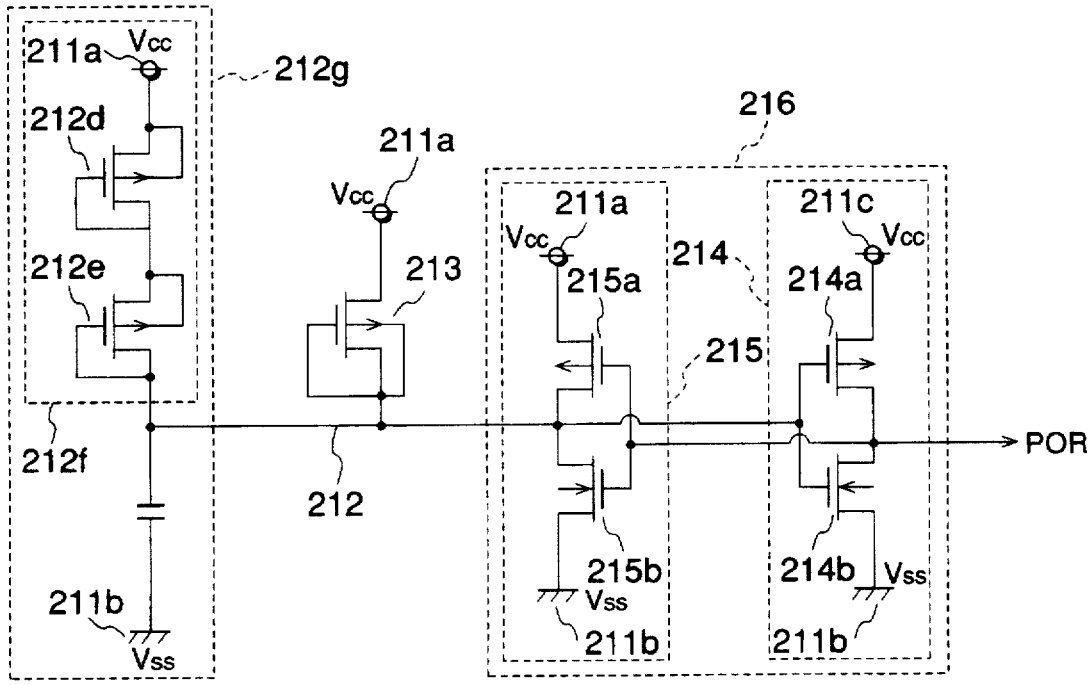
FIG. 7 is a circuit diagram showing a still further example of the POR generation circuit according to the invention.
Figure 8:
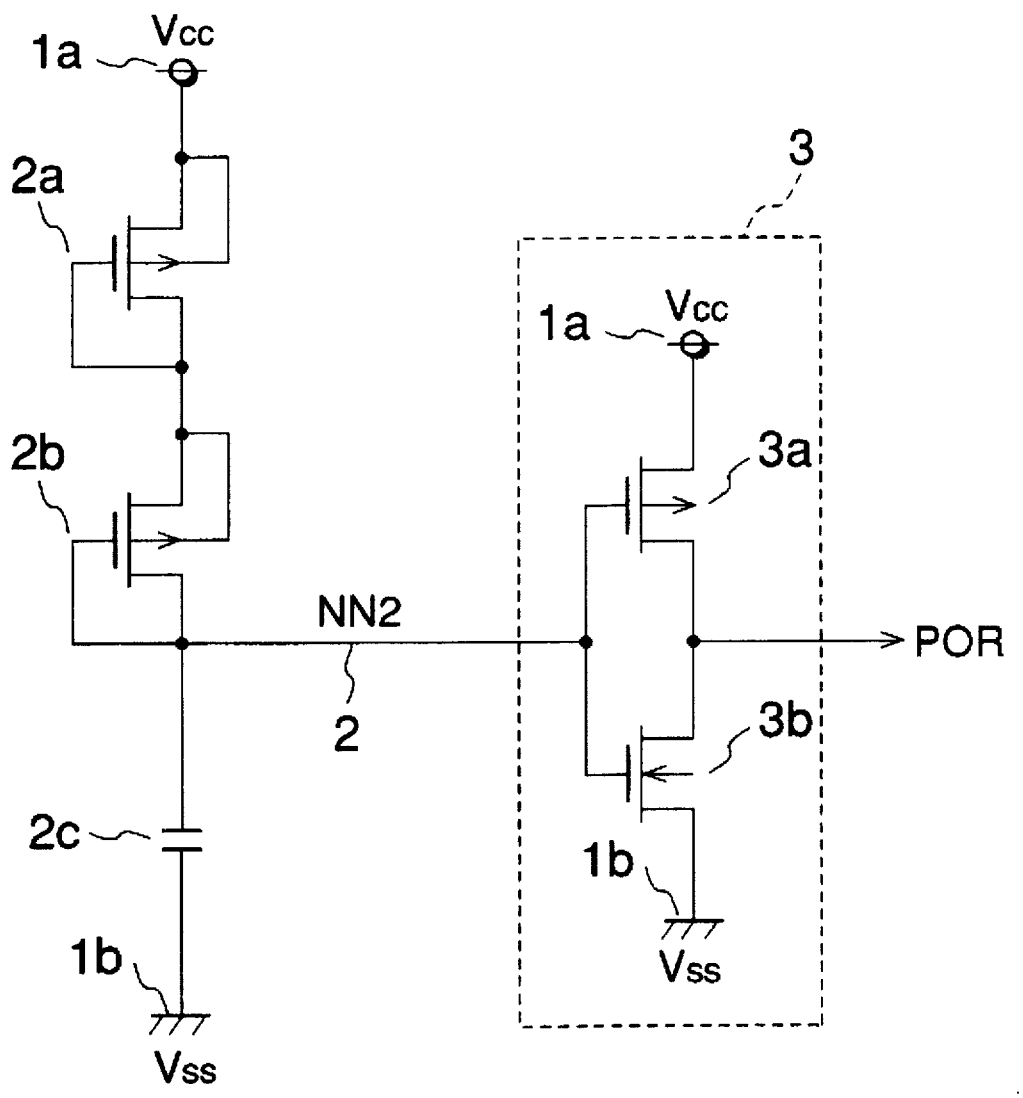
FIG. 8 is a circuit diagram showing a POR generation circuit according to the prior art.
Figure 9:
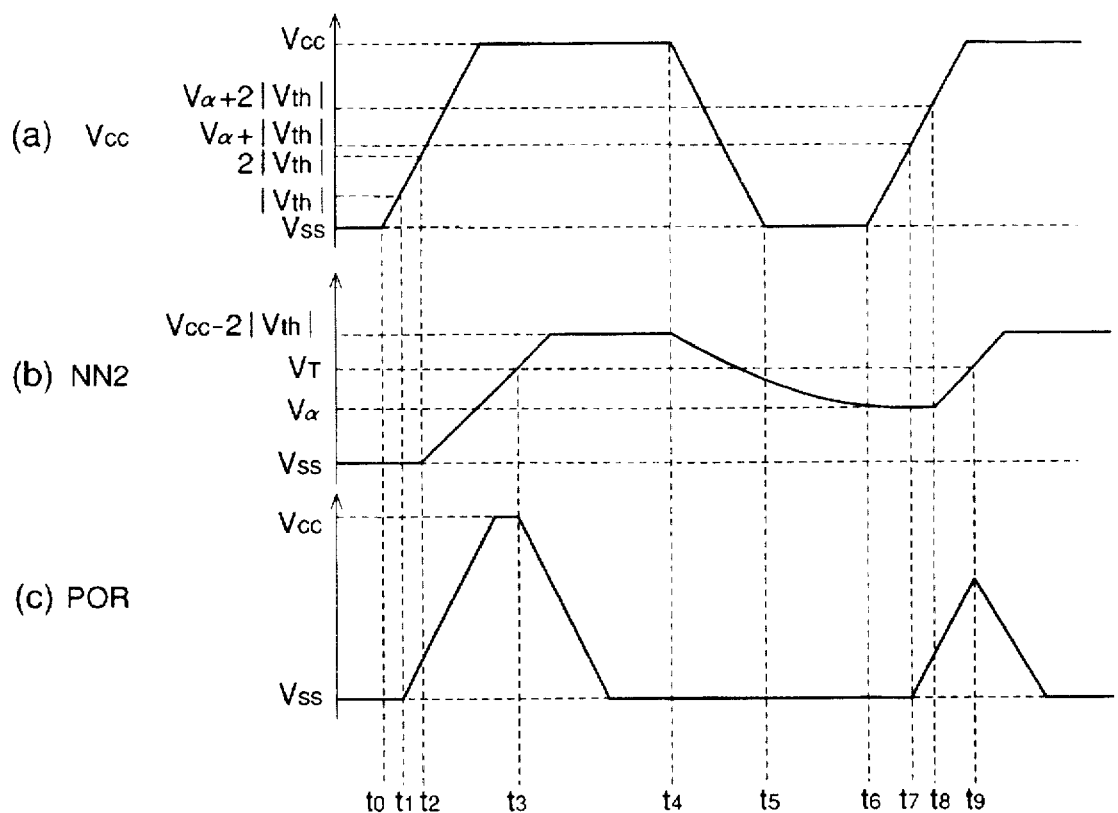
FIG. 9 is a timing chart showing the operation of the POR generation circuit in accordance with the prior art.

Further, although the N-channel MOS transistor 213 is employed as a discharging transistor, it is also possible to employ a P-channel MOS transistor 217 as shown in FIG. 6. Furthermore, it is also possible to employ P-channel MOS transistors 212d and 212e as shown in FIG. 7 instead of the N-channel MOS transistors 212d and 212e.

According to the preceding embodiments described above, a semiconductor integrated circuit comprises a discharge element which is discharged rapidly to approximately a grounding potential level after a power source is turned off.

Further, according to the invention, a semiconductor integrated circuit comprises a POR generation circuit for generating a normal pulse capable of controlling and initializing the internal circuit even when a power source is turned on immediately after the power source has been turned off.

The invention has been described with respect to certain embodiments. Various modifications and additions within the spirit of the invention will occur to those of skill in the art. Accordingly, the scope of the invention is limited solely by the following claims.

I claim:

1. A semiconductor integrated circuit comprising:
   a source potential responsive circuit including a pull-up circuit connected between a source potential node and a connecting node, and a capacitor connected between said connecting node and an earth potential node, said pull-up circuit conducting a charging current from the source potential node to the connecting node to charge the capacitor when a rising potential applied to the source potential node exceeds a potential at the connecting node by a predetermined threshold value,
   a holding circuit responsive to the potential at the connecting node for outputting a power-on reset signal changing from a first level to a second level when the potential at the connecting node exceeds a first predetermined level, and for holding the potential of the power-on reset signal at the second level until the potential of the connecting node exceeds a second predetermined level higher than said first predetermined level; and
   a diode-connected MOS transistor having a gate and a back gate thereof connected together and being disposed in a forward direction from the connecting node to the source potential node for discharging the capacitor via the connecting node to the source potential node when the potential of the connecting node exceeds the potential at the source potential node by approximately 0.25 volt.

2. A semiconductor integrated circuit comprising:
   a source potential responsive circuit including a pull-up circuit connected between a source potential node and a connecting node, and a capacitor connected between said connecting node and an earth potential node, said pull-up circuit conducting a charging current from the source potential node to the connecting node to charge the capacitor when a power source potential applied to the source potential node exceeds a potential of the connecting node by a predetermined threshold value,
   a holding circuit responsive to the potential at the connecting node for outputting a power-on reset signal changing from a first level to a second level when the potential at the connecting node exceeds a first predetermined level, and for holding the potential of the power-on reset signal at the second level until the potential at the connecting node exceeds a second predetermined level higher than said first predetermined level; and
   a diode-connected MOS transistor having a gate and a back gate thereof connected together and being disposed in a forward direction from the connecting node to the source potential node, for discharging the capacitor via the connecting node to the source potential node when the potential at the source potential node falls below the potential at the connecting node by an absolute value of the threshold potential of said diode-connected MOS transistor having the back gate and the gate thereof connected together.

3. The semiconductor integrated circuit of claim 2, wherein
   said pull-up circuit comprises two diode-connected MOS transistors connected in series and disposed in a forward direction from the source potential node to the connecting node.

4. The semiconductor integrated circuit of claim 3, wherein
   said two diode-connected MOS transistors are P-channel MOS transistors, each having a back gate and a source connected together.

5. The semiconductor integrated circuit of claim 2, wherein said holding circuit comprises a first MOS inverter and a second MOS inverter, said first MOS inverter being responsive to the potential at the connecting node for providing the power-on reset signal at an output node, and said second MOS inverter being responsive to the power-on reset signal for latching the power-on reset signal.

6. The semiconductor integrated circuit of claim 5, further comprising;
   multiple stages of MOS inverters connected to the output node of said first MOS inverter to serve as drivers.

7. An operating method for a power-on reset circuit including a source potential node for receiving an external power source potential having a given rise time, an earth potential node for receiving an earth potential, and a capacitor coupled between the source and earth potential nodes for receiving a charge from said external power source potential, said method comprising:

charging said capacitor in response to a change of potential at the source potential node from a first potential to a second potential to generate a rising capacitor voltage;

activating a power-on reset signal in response to the rising capacitor voltage; and discharging the capacitor through a diode connected MOS transistor, having a back gate and a gate connected together, into the source potential node when the capacitor potential exceeds the potential of the source potential node by approximately 0.25 volt.

8. An operating method for a power-on reset circuit for generating a power-on reset signal, said circuit including a source potential node for receiving an external power source potential having a given rise time, an earth potential node for receiving an earth potential, and a capacitor coupled between the source and earth potential nodes for receiving said external power source potential, wherein the power-on reset circuit tends to malfunction when the capacitor fails to substantially discharge before an external power source potential is reapplied to the power source potential node, said method comprising:

charging said capacitor in response to a change of potential at the source potential node from a first potential to a second potential to generate a rising capacitor voltage;

activating a power-on reset signal in response to the rising capacitor voltage; and discharging the capacitor into the source potential node through a diode connected MOS transistor having a back gate and a gate thereof connected together.

9. An operating method of claim 8, further comprising the step of:

reapplying said external power source potential to said source potential node after said discharging step.

* * * * *